United States Patent
Sporer et al.

(10) Patent No.: US 10,943,814 B1
(45) Date of Patent: Mar. 9, 2021

(54) ETCH STOP MEMBER IN BURIED INSULATOR OF SOI SUBSTRATE TO REDUCE CONTACT EDGE PUNCH THROUGH

(71) Applicant: GLOBALFOUNDRIES U.S. Inc., Santa Clara, CA (US)

(72) Inventors: Ryan W. Sporer, Mechanicville, NY (US); Jiehui Shu, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 0 days.

(21) Appl. No.: 16/547,474

(22) Filed: Aug. 21, 2019

(51) Int. Cl.
| | |
|---|---|
| *H01L 21/762* | (2006.01) |
| *H01L 29/06* | (2006.01) |
| *H01L 21/768* | (2006.01) |
| *H01L 21/74* | (2006.01) |

(52) U.S. Cl.
CPC ...... *H01L 21/76264* (2013.01); *H01L 21/743* (2013.01); *H01L 21/76831* (2013.01); *H01L 29/0649* (2013.01)

(58) Field of Classification Search
CPC ............ H01L 21/76264; H01L 21/743; H01L 21/76831; H01L 29/0649
See application file for complete search history.

(56) References Cited

U.S. PATENT DOCUMENTS

| | | | |
|---|---|---|---|
| 6,521,947 B1 | 2/2003 | Ajmera et al. | |
| 9,337,079 B2 | 5/2016 | Loubet et al. | |
| 2009/0127626 A1* | 5/2009 | Zhu ................... | H01L 21/31053 257/368 |
| 2012/0112309 A1* | 5/2012 | Dennard ........... | H01L 21/76283 257/506 |

* cited by examiner

*Primary Examiner* — Zandra V Smith
*Assistant Examiner* — Andre C Stevenson
(74) *Attorney, Agent, or Firm* — Anthony Canale; Hoffman Warnick LLC (57) ABSTRACT

A method forms a trench isolation opening extending into an SOI substrate, and forms an etch stop member in a portion of the insulator layer abutting a side of the trench isolation opening. The etch stop member has a higher etch selectivity than the insulator layer of the SOI substrate. A trench isolation is formed in the trench isolation opening. A contact is formed to a portion of the semiconductor layer of the SOI substrate. The etch stop member is structured to prevent contact punch through to the base substrate of the SOI substrate.

18 Claims, 12 Drawing Sheets

ETCH STOP MEMBER IN BURIED INSULATOR OF SOI SUBSTRATE TO REDUCE CONTACT EDGE PUNCH THROUGH

BACKGROUND

The present disclosure relates to semiconductor device fabrication, and more specifically, to methods of reducing contact edge punch through in a semiconductor-on-insulator (SOI) substrate by using an etch stop member in a buried insulator and abutting a trench isolation.

Semiconductor-on-insulator (SOI) technology typically refers to the use of a layered semiconductor-insulator-semiconductor substrate in place of a more conventional semiconductor substrate (bulk substrate) in semiconductor manufacturing, especially microelectronics. SOI-based devices differ from conventional silicon-built devices in that the semiconductor junction is above an electrical insulator, typically silicon dioxide or (less commonly) sapphire. The choice of insulator depends largely on intended application, with sapphire being used for radiation-sensitive applications and silicon oxide preferred for improved performance and diminished short channel effects in microelectronics devices. The precise thickness of the insulating layer and topmost semiconductor-on-insulator (SOI) layer also vary widely with the intended application. SOI substrates are commonly used to form a large variety of devices such as: static random access memory (SRAM), clock synchronized RAM (CSRAM), logic devices, etc.

During formation of semiconductor devices, electrical contacts are formed through dielectric layers to electrically interconnect desired components with other components, e.g., source, drain or gates of a transistor. Each component is positioned within a selected layer within the semiconductor device that is covered by a dielectric. Typically, the contacts are formed by patterning a mask over the dielectric layer and etching to form an opening in the dielectric to the desired component therebelow. The opening is then filled with a liner and a conductor to form the contact. One challenge relative to forming contacts using SOI substrates is ensuring the contact opening does not extend into the layer below, which is referred to as "punch through." Punch through leads to the contact being in the wrong location and possibly making the device non-functional. Consequently, punch through can cause problems with yield during fabrication and/or performance degradation of the final device. The challenge of controlling punch through is magnified with smaller semiconductor devices, e.g., 14 nanometer technology node and beyond, and where SOI substrate contact formation occurs simultaneously with other substrates, e.g., bulk devices, that may not have the same thickness. One approach to address punch through with SOI substrates is to control the etch selectivity of whatever etching technique is employed. This approach is not always effective because, for example, it is difficult to effectively detect end points of the etching for the small contacts, and different areas may have components at different depths, requiring different etch durations to create the openings.

One type of punch through is referred to as "edge punch through" and refers to overetching into a divot or recess next to a trench isolation at the boundary of different regions of the substrate, e.g., between an active region and another region. A trench isolation is a form of isolation in which a trench is etched into the substrate and filled with an insulating material such as oxide, to isolate one region of the substrate from an adjacent region of the substrate. One or more transistors of a given polarity may be disposed within an area isolated by the trench isolation. Edge punch through can cause direct shorts to the underlying substrate.

SUMMARY

A first aspect of the disclosure is directed to a method, comprising: providing a semiconductor-on-insulator (SOI) substrate including a semiconductor layer over an insulator layer over a base substrate; forming a trench isolation opening extending into the SOI substrate; forming an etch stop member in a portion of the insulator layer abutting a side of the trench isolation opening, the etch stop member having a higher etch selectivity than the insulator layer; forming a trench isolation in the trench isolation opening; and forming a contact to a portion of the semiconductor layer, the etch stop member preventing contact punch through to the base substrate.

A second aspect of the disclosure includes a structure, comprising: a semiconductor-on-insulator (SOI) substrate including a semiconductor layer over an insulator layer over a base substrate; a trench isolation in the SOI substrate; an etch stop member in a portion of the insulator layer abutting a side of the trench isolation, the etch stop member having a higher etch selectivity than the insulator layer; and a contact to a portion of the semiconductor layer, the etch stop member structured to prevent contact punch through to the base substrate.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide methods of forming an etch stop member in a portion of the insulator layer of an SOI substrate abutting a side of a trench isolation. The etch stop member has a higher etch selectivity than the insulator layer of the SOI substrate. A contact can be formed to a portion of the semiconductor layer of the SOI substrate. The etch stop member is structured to prevent contact punch through of the contact to the base substrate of the SOI substrate, i.e., by at least its position and material. Embodiments of a structure including the etch stop member are also disclosed herein.

Figure 1:
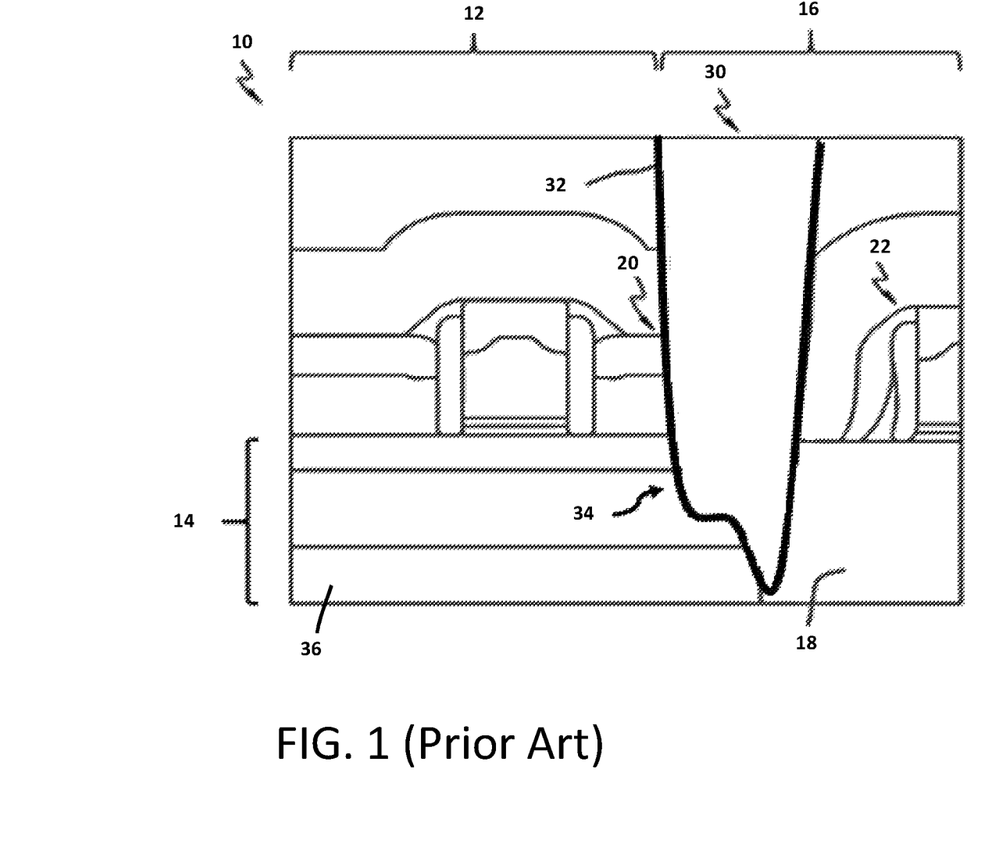
FIG. 1 shows a cross-sectional view of an example of a portion of a conventional semiconductor structure, illustrating contact "punching-through" to the SOI base substrate.

Referring to the drawings, FIG. 1 shows a cross-sectional view of an example of a portion of a conventional semiconductor structure 10 illustrating contact punch-through. Conventional semiconductor structure 10 includes an active region 12 in a semiconductor-on-insulator (SOI) substrate 14. Active region 12 is isolated from another region 16 in SOI substrate 14 by a trench isolation 18. As illustrated, active region 12 includes a silicided source/drain region 20 adjacent trench isolation 18. The other region 16 may include any region over trench isolation 18 or beyond trench isolation 18 that includes devices requiring isolation from active region 12. As shown in FIG. 1, the other region may include for example, a dummy transistor 22. Conventional semiconductor structure 10 may be formed using any now known or later developed semiconductor fabrication techniques.

Conventional semiconductor structure 10 includes a contact 30 within contact opening 32. At least a portion of contact opening 32 frequently overlaps an edge between active region 12, and more particularly, silicided source/drain region 20, and trench isolation 18, causing the contact opening to exhibit "edge punch through" 34 relative to trench isolation 18. When contact 30 is formed, the edge punch through can create direct shorts to base substrate 36 of SOI substrate 14, which at the very least negatively impacts performance and can render the device inoperative.

Figure 2:
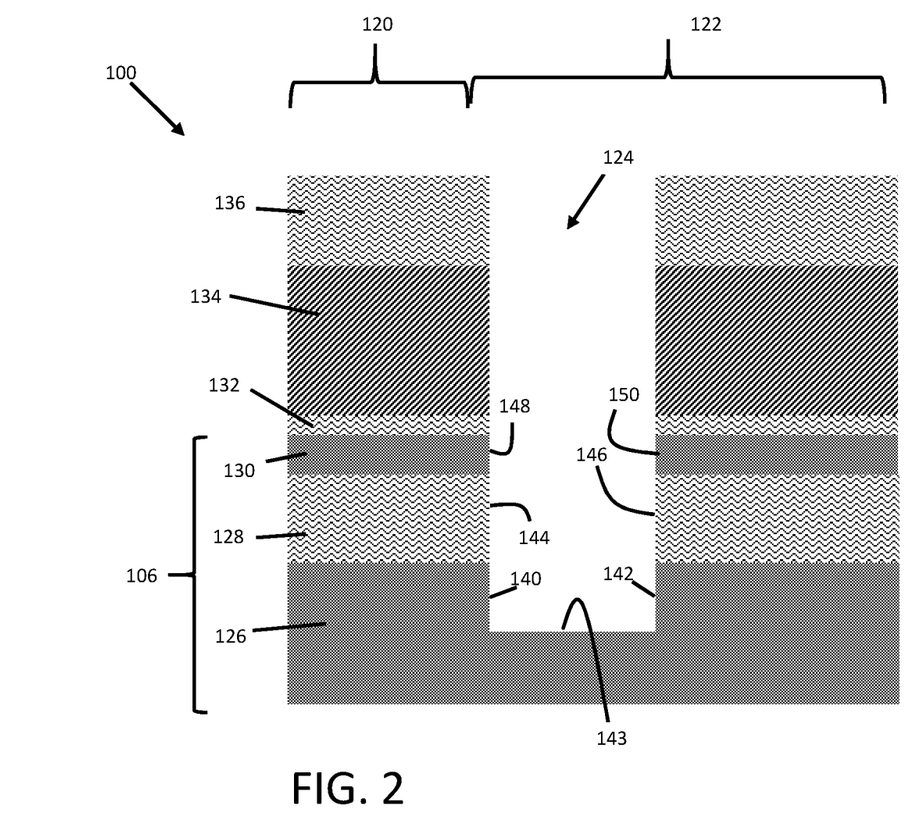
FIG. 2 shows a cross-sectional view of a portion of an initial semiconductor structure for forming an etch stop member in a semiconductor-on-insulator (SOI) substrate, according to embodiments of the disclosure.

FIG. 2 shows a cross-sectional view of an initial structure 100 of a structure for a method of forming an etch stop member, according to embodiments of the disclosure. The etch stop member is formed to abut a trench isolation 152 (FIG. 10) to prevent punch-through of contact opening 250 (FIG. 11) to a base substrate 126 of a semiconductor-on-insulator (SOI) substrate 106 during formation of the contact opening. At this stage, initial structure 100 provides SOI substrate 106 including a semiconductor base substrate 126 (hereinafter "base substrate 126"), an insulator layer 128 and a semiconductor-on-insulator (SOI) layer 130 (hereinafter "semiconductor layer 130"). SOI substrate 106 may be a fully depleted SOI (FDSOI) substrate, meaning it uses an ultra-thin layer of insulator 128, and a very thin semiconductor layer 130 over insulator layer 128 that provides the transistor channel. The ultra-thin semiconductor layer 130 does not need to be doped to create the channel, thus making the transistor "fully depleted." The thicknesses of the layers may vary depending on technology node.

Figure 10:
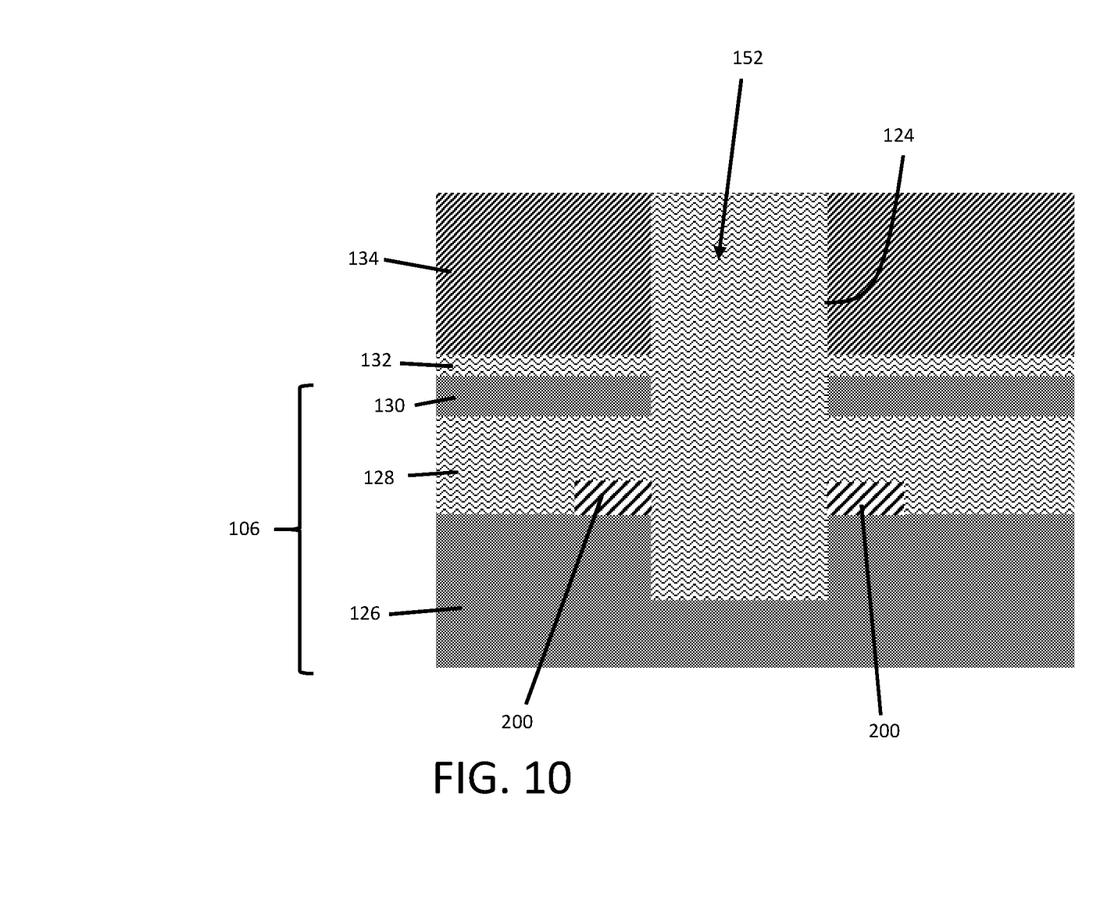
FIG. 10 shows a cross-sectional view of forming a trench isolation abutting the etch stop member, according to embodiments of the disclosure.

FIG. 2 also shows forming trench isolation opening 124 extending into SOI substrate 106. In this fashion, initial structure 100 may include a first region 120 of SOI substrate 106 isolated from another, second region 122 of SOI substrate 106 by trench isolation opening 124 etched into SOI substrate 106 (e.g., by RIE). Trench isolation opening 124 will be eventually filled to form trench isolation 152 (FIG. 10). As shown in the example of FIG. 2, initial structure 100 may also include pad layers 132, 134, formed over SOI substrate 106. As shown in the example of FIG. 2, formation of trench isolation opening 124 may expose surfaces 140, 142, 143 of base substrate 126, surfaces 144, 146 of insulator layer 128, and surfaces 148, 150 of semiconductor layer 130. As shown in the example of FIG. 2, surfaces (not labeled) of pad layers 132, 134 may also be exposed during the formation of trench isolation opening 124.

Base substrate 126 and semiconductor layer 130 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of each layer may be strained. For example, semiconductor layer 130 (and/or epi layer thereover) may be strained.

Insulator layer 128 may include any now known or later developed dielectric used for semiconductor devices such as but not limited to silicon oxide ($SiO_2$) or sapphire. As noted, the choice of insulator depends largely on intended, application, with sapphire being used for radiation-sensitive applications and silicon oxide preferred for improved performance and diminished short channel effects in microelectronics devices. The precise thickness of insulator layer 128 and topmost semiconductor layer 130 also vary widely with the intended application. Insulator layer 128 is sometimes referred to as a 'buried insulator layer' or a 'buried oxide (BOX) layer'.

Pad layers 132, 134 may include any now known or later developed pad layers for formation of trench isolation 152 (FIG. 10), such as but not limited to pad oxide or pad nitride. For example, in the non-limiting example of FIG. 2, pad layer 132 may include a pad oxide layer and pad layer 134 may include a pad nitride layer. Where a pad nitride layer is selected, the layer may include, for example, any now known or later developed nitride barrier, such as but not limited to silicon nitride. Where a pad oxide layer is selected, the layer may include, for example, any now known or later developed pad oxide, such as but not limited to silicon oxide.

Initial structure 100 may be formed using any now known or later developed semiconductor fabrication techniques including by not limited to photolithography (and/or sidewall image transfer (SIT)). In lithography (or "photolithography"), a radiation sensitive "resist" coating is formed, e.g., deposited, over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

Where materials are deposited, "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react with the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Trench isolation opening 124 may be formed, for example, using a patterned mask 136 and etching the various layers, and then removing mask 136. Mask 136 may include, for example, an oxide hard mask, and may remain in place during most of the processing according to embodiments of the disclosure. Trench isolation opening 124 may have any depth desired. In this regard, trench isolation opening 124 may extend just slightly into base substrate 126, e.g., 10% of the thickness of base substrate 126, or may extend a significant distance into base substrate 126, e.g., 80% of the thickness of base substrate 126. Only one depth of trench isolation opening 124 has been illustrated for clarity. The eventually formed trench isolation(s) may provide deep or shallow trench isolations. While only one trench isolation opening 124 has been illustrated, it is understood that any number of trench isolation openings 124, trench isolations 152 (FIG. 10) and related etch stop members 200 (FIG. 9) may be formed according to embodiments of the disclosure.

At this stage in conventional processing, trench isolation opening 124 would be filled with an insulating material such as silicon oxide to form a trench isolation, isolating first region 120 from second region 122. The remainder of the semiconductor structure would then be formed, by conventional processing, including a contact opening to a silicided source/drain region. As shown in FIG. 1, and discussed above, at least a portion of the contact opening 32 frequently overlaps an edge between active region 102, and more particularly, silicided source/drain region 20 and trench isolation 18, causing contact opening 32 to exhibit "edge punch through" 34 relative to the trench isolation. As noted in the discussion of FIG. 1, when the contact is eventually formed, edge punch through 34 can create direct shorts to base substrate 36, which at the very least negatively impacts performance and can render the device inoperative.

As shown in FIGS. 3-10, in contrast to conventional processing, embodiments of the disclosure include forming an etch stop member 200 (FIGS. 9-10) in a portion of insulator layer 128 abutting a side of trench isolation opening 124 and a trench isolation 152 (FIG. 10) formed therein. Etch stop member 200 (FIGS. 9-12) has a higher etch selectivity than insulator layer 128, and thus prevents punch through of contact opening 250 (FIG. 11) to base substrate 126.

Figure 7:
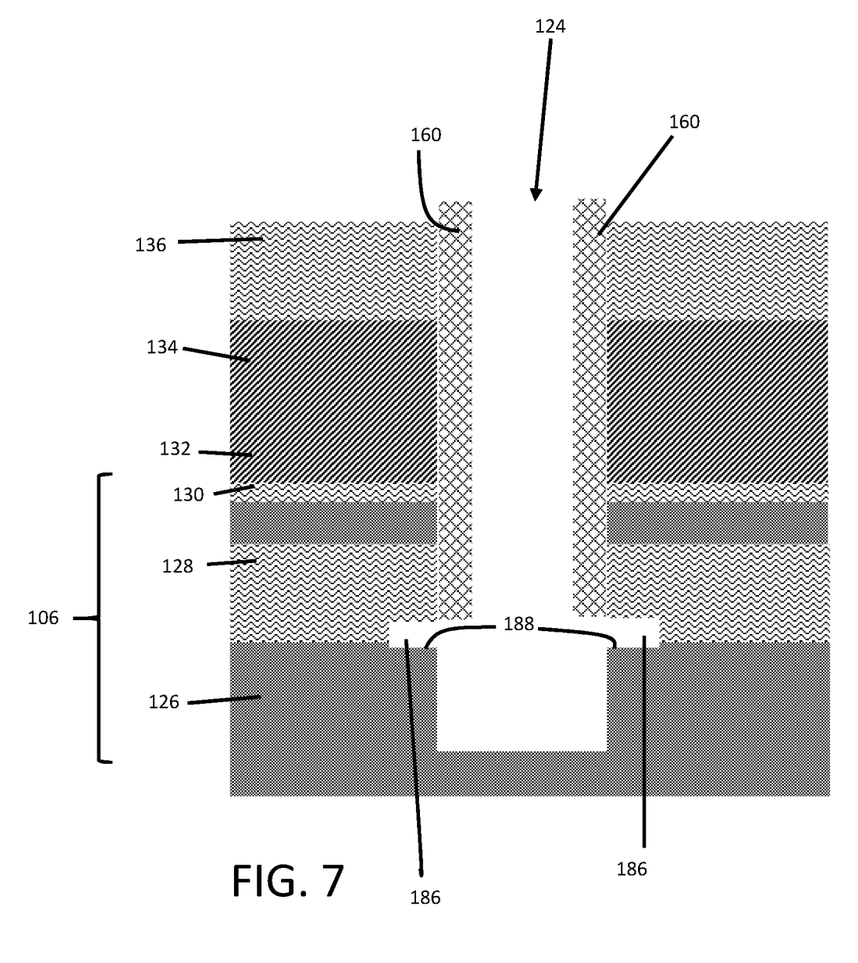
FIG. 7 shows a cross-sectional view of forming an opening in an insulator layer of the SOI substrate to the side of the trench isolation opening using the liner mask, according to embodiments of the disclosure.
Figure 8:
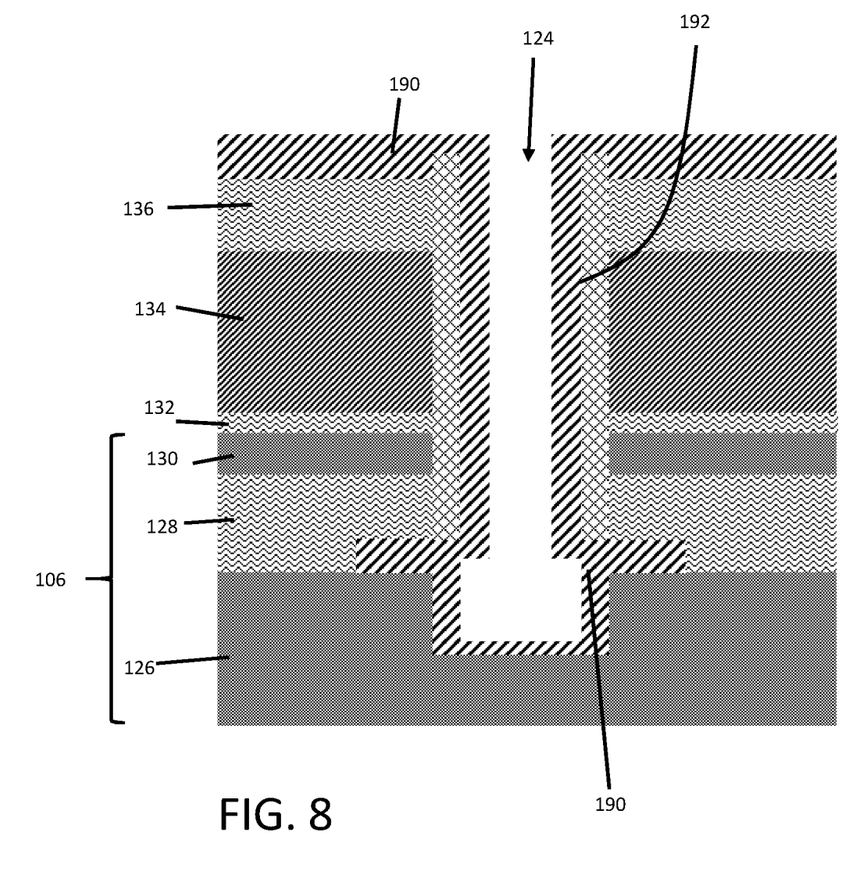
FIG. 8 shows a cross-sectional view of forming an etch stop material in the opening, according to embodiments of the disclosure.
Figure 9:
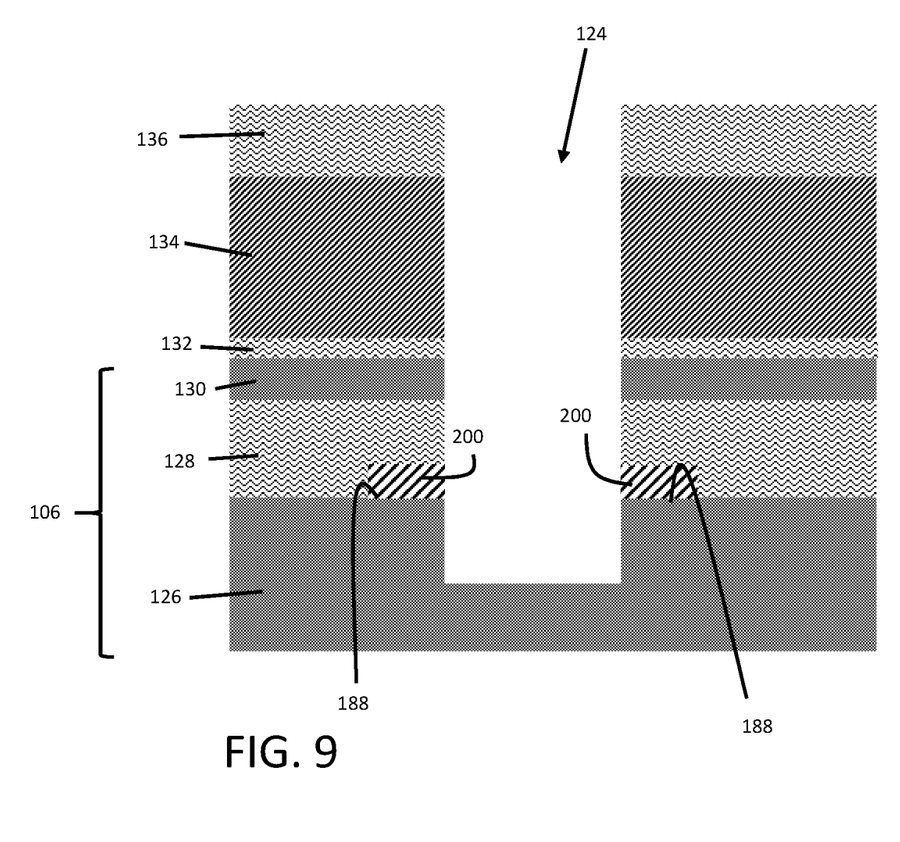
FIG. 9 shows a cross-sectional view of forming an etch stop member in the opening, according to embodiments of the disclosure.

FIGS. 3-10 show embodiments of a method of forming etch stop member 200 (FIGS. 9-10).

Figure 3:
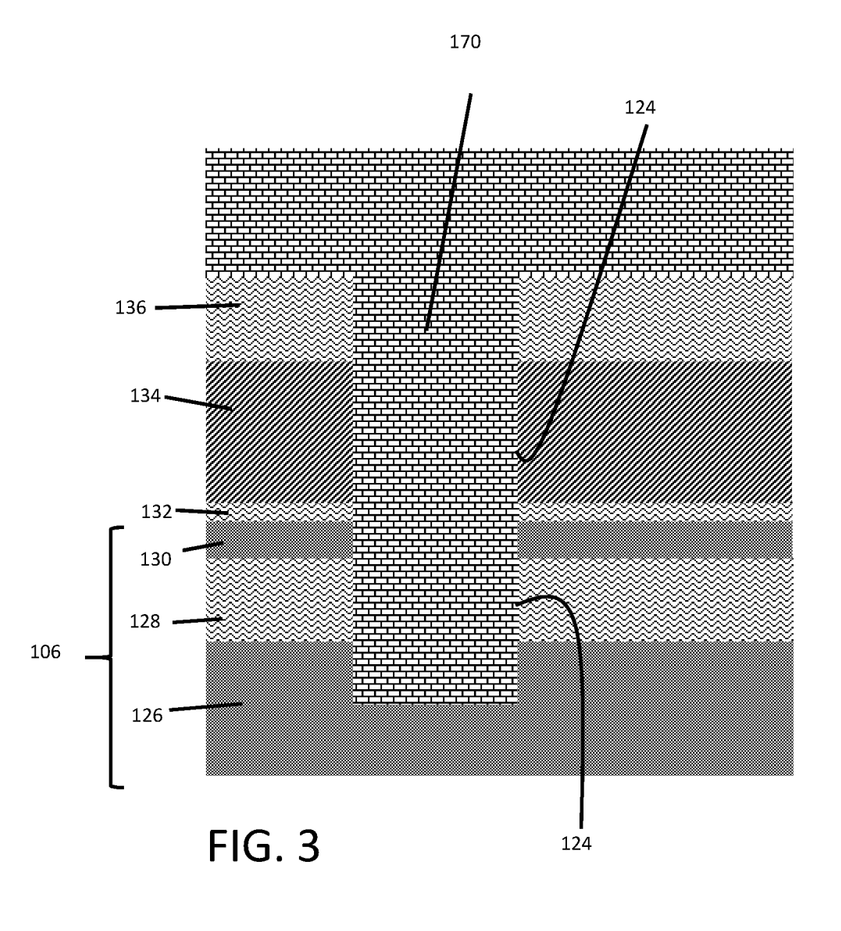
FIG. 3 shows a cross-sectional view of forming a sacrificial material in a trench isolation opening, according to embodiments of the disclosure.

FIGS. 3-6 show cross-sectional views of forming a liner mask 160 (FIG. 6) on sidewalls 162 (FIG. 6) of trench isolation opening 124 that exposes a portion of insulator layer 128. Liner mask 160 (FIG. 6) may be formed in a number of ways. In one embodiment of the disclosure, liner mask 160 (FIG. 6) may be formed by first, as shown in FIG. 3, depositing a sacrificial material 170 in trench isolation opening 124. Sacrificial material 170 may include, for example, an organic planarization layer (OPL) material or a spin-on-hard mask (SOH) material. OPL may be any "planarizing layer," which generally refers to any material formed on a surface to produce a planar surface, and can be formed by, e.g., the deposition of material followed by polishing, deposition followed by the forming of a flowable oxide material thereon, deposition alone, and/or any other currently known or later developed process or combination of processes. The OPL may include one or more carbon films removable by wet and/or dry etching processes, may be formed by blanket depositing of the OPL over each exposed structural element, and then etching the OPL back to a desired height. SOH may include any spin-on hard mask material, which may be etched or polished to a desire height.

Figure 4:
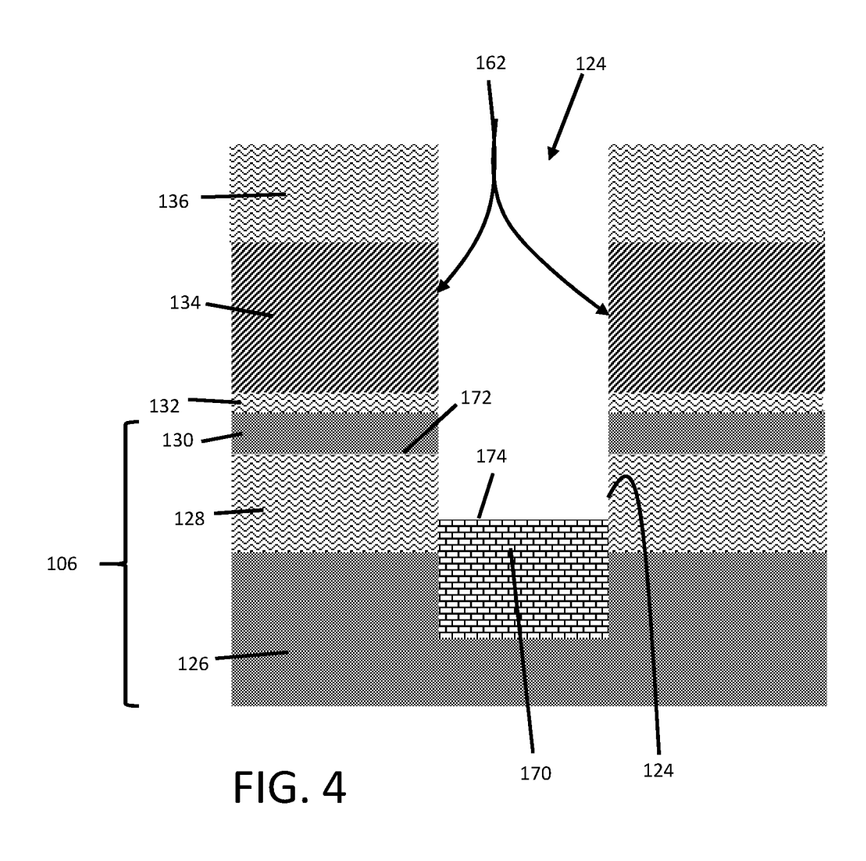
FIG. 4 shows a cross-sectional view of recessing the sacrificial material, according to embodiments of the disclosure.
Figure 5:
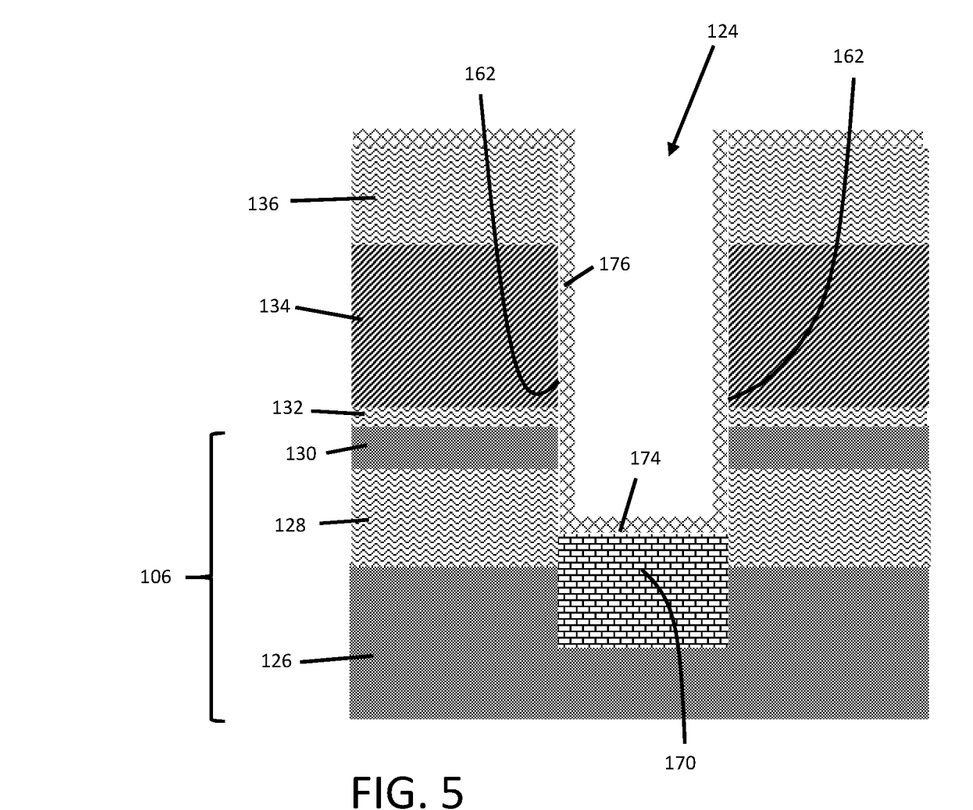
FIG. 5 shows a cross-sectional view of forming a liner, according to embodiments of the disclosure.

FIG. 4 shows a cross-sectional view of recessing sacrificial material 170 in trench isolation opening 124 to create an upper surface 174 of sacrificial material 170 below an upper surface 172 of insulator layer 128. That is, there is space between upper surface 174 for sacrificial material 170 and upper surface 172 of insulator layer 128. The recessing may include any appropriate etch for the sacrificial material 170 employed, e.g., a standard clean 1 (SC1 or Huang1) (i.e., peroxide, ammonia, water), or a standard clean 2 (SC2 or Huang2) (i.e., peroxide, hydrogen chloride (HCl) and water) for an OPL or SOH. It is noted that the etching does not impact insulator layer 128 (e.g., of oxide). FIG. 5 shows a cross-sectional view of forming a liner 176 over upper surface 174 of sacrificial material 170 and on sidewalls 162 of trench isolation opening 124. Liner 176 may include, for example, silicon nitride ($Si_3N_4$), and may be deposited using any appropriate deposition technique, e.g., ALD.

Figure 6:
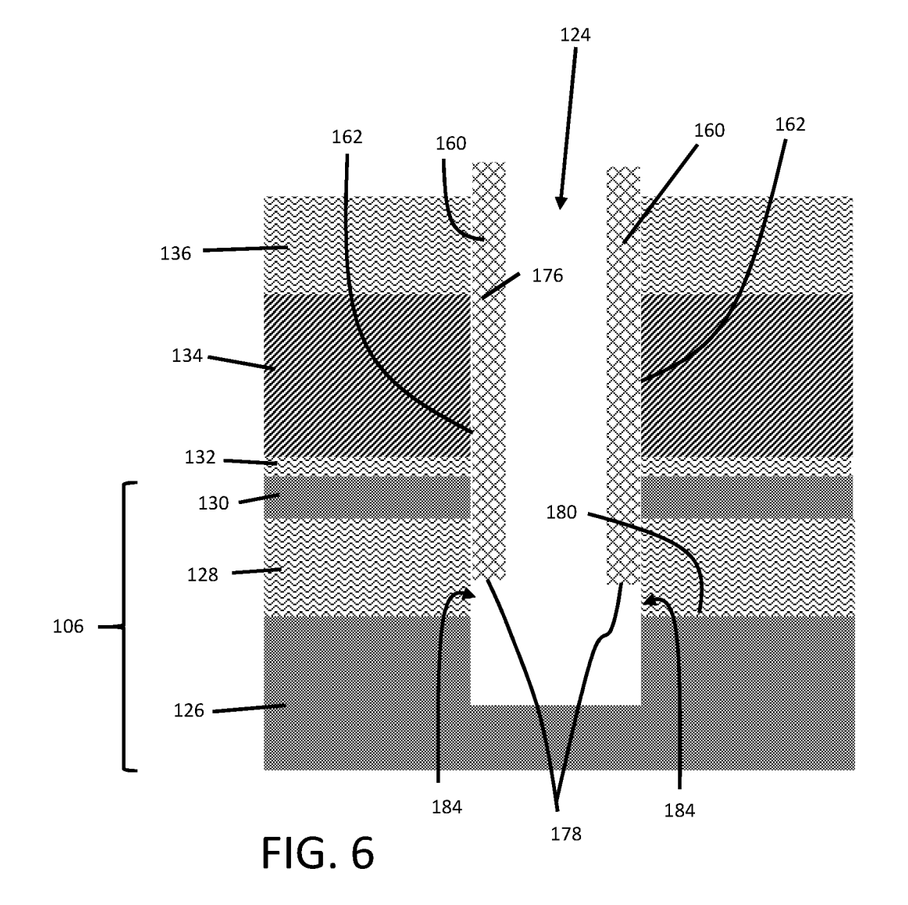
FIG. 6 shows a cross-sectional view of forming a liner mask, according to embodiments of the disclosure.

FIG. 6 shows a cross-sectional view of removing liner 176 from upper surface 174 (FIG. 5) of sacrificial material 170 (FIG. 5) and removing sacrificial material 170, leaving liner 176 on sidewalls 162 of trench isolation opening 124 to create a liner mask 160. As illustrated, a lower end 178 of liner mask 160 is above a lower surface 180 of insulator layer 128. That is, there is space between lower end 178 of liner mask 160 and lower surface 180 of insulator layer 128, exposing a portion 184 of insulator layer 128 to trench isolation opening 124. The removing step(s) may include, for example, anisotropic etching using an oxygen-based plasma. Liner mask 160 exposes portion 184 of insulator layer 128 on a first side and a second side of trench isolation opening 124. That is, a portion 184 of surfaces 144, 146 (FIG. 2) of insulator layer 128 is exposed to trench isolation opening 124.

Once liner mask 160 is formed, as shown in the cross-sectional view of FIG. 7, an opening 186 may be formed by isotropically etching into portion 184 (FIG. 6) of insulator layer 128 using liner mask 160. The isotropic etching of opening 186 creates the opening into portion 184 (FIG. 6) of insulator layer 128 and exposes a portion of an upper surface 188 of base substrate 126. The isotropic etching may create openings 186 in the first side and the second side of insulator layer 128 adjacent trench isolation opening 124. A width (side-to-side) of opening 186 can be controlled by controlling the duration of the isotropic etching.

FIG. 8 shows a cross-sectional view of depositing etch stop material 190 in opening(s) 186 and over sidewalls 192 of liner mask 160. Etch stop material 190 includes an insulating material having an etch selectivity higher than insulator layer 128. In one embodiment, etch stop material 190 has an at least somewhat similar dielectric constant (K) to insulator layer 128, e.g., for silicon oxide, K=3.9, and an at least somewhat similar band gap voltage to insulator layer 128, e.g., for silicon oxide, $E_G$=8.9 eV. In one embodiment, etch stop material 190 may include aluminum oxide ($Al_2O_3$) (K=9, $E_G$=8.7 eV) or hafnium oxide ($HfO_2$) (K=25, $E_G$=5.7 eV). Other insulating materials may also be employed.

FIG. 9 shows etching to remove etch stop material 190 and liner mask 160, leaving the etch stop material 190 in opening(s) 186 to form an etch stop member 200. As illustrated, etch stop member 200 contacts the portion of upper surface 188 of base substrate 126, and is otherwise surrounded by insulating layer 128. Etch stop member 200 is in a portion of insulator layer 128 abutting the first side and the second side of trench isolation opening 124. Etch stop member 200 has a thickness that is less than a thickness of insulator layer 128. In one example, etch stop member 200 may have a width (side-to-side on page) between 6 and 12 nanometers, e.g., for the 14 nanometer technology node. However, the width may vary depending on the technology node in which employed. The etching may include any isotropic etching appropriate for the materials to be removed such as a RIE to remove etch stop material 190, and a wet etch to remove liner mask 160, e.g., a diluted hydrofluoric (DHF) wet etch. Other etches may also be possible.

FIG. 10 shows a cross-sectional view of forming trench isolation 152 in trench isolation opening 124. Trench isolation 152 may be formed by depositing an insulating material, such as but not limited to silicon oxide, into trench isolation opening 124, and planarizing. Insulating fill material may be formed by deposition, CVD, EHARP, or any other now known or later developed semiconductor trench isolation fill fabrication techniques. The planarization may remove mask 136 from over pad nitride layer 134.

Figure 11:
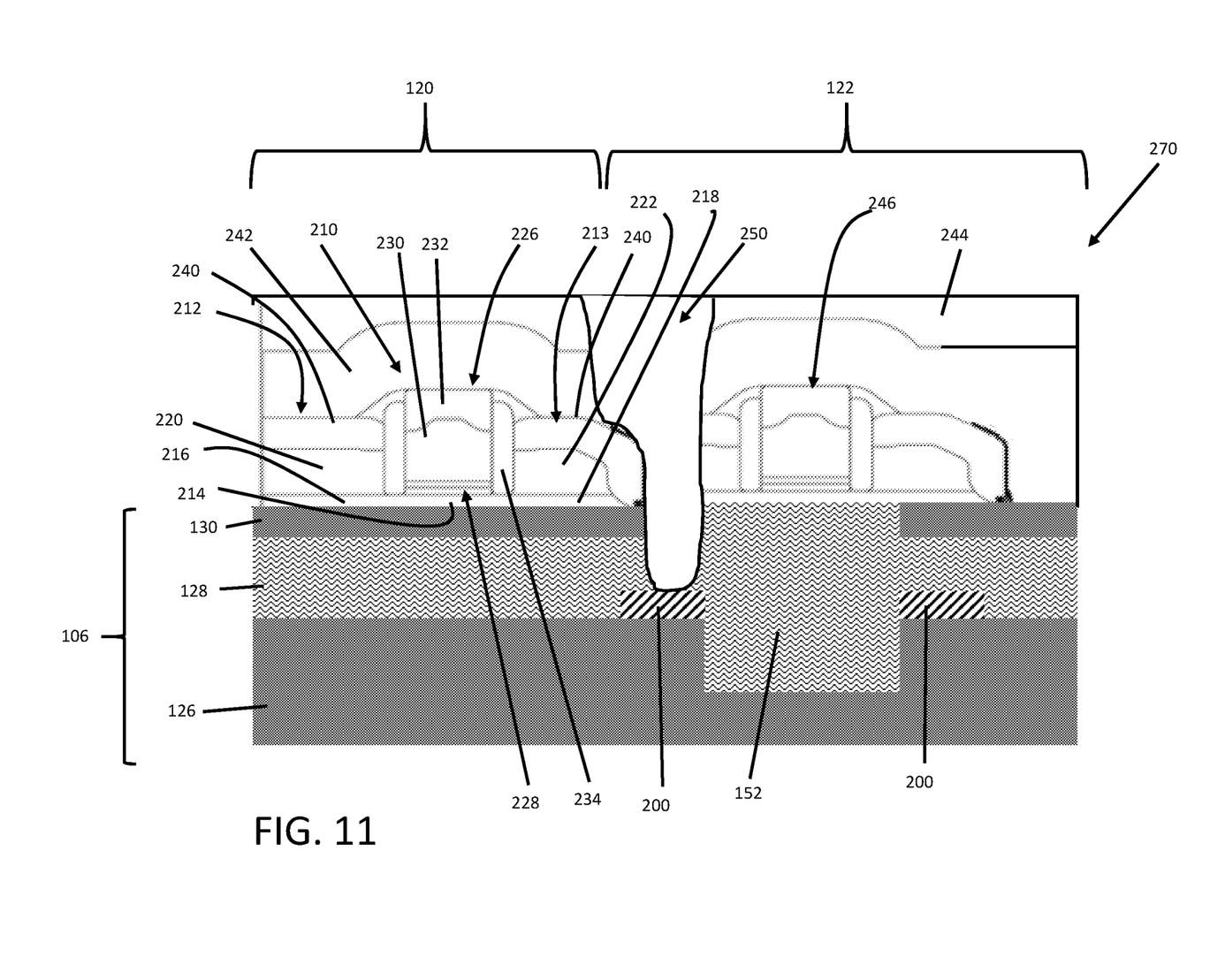
FIG. 11 shows a cross-sectional view of forming a contact opening to an etch stop member, according to embodiments of the disclosure.
Figure 12:
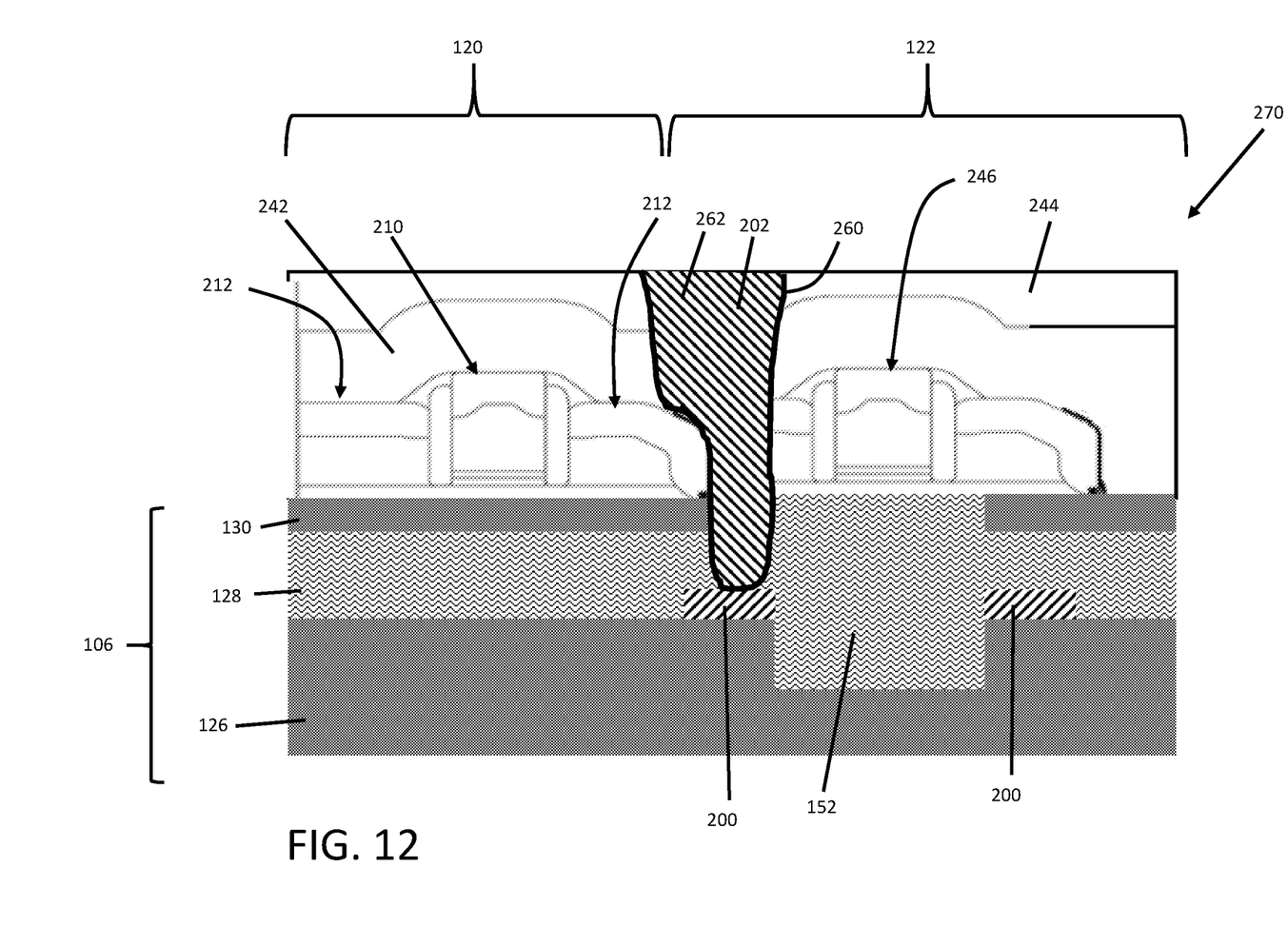
FIG. 12 shows a cross-sectional view of forming a contact, according to embodiments of the disclosure.

FIGS. 11-12 show cross-sectional views of forming a contact 202 (FIG. 12) to a portion of semiconductor layer 130 during which etch stop member 200 is structured to prevent contact punch through to base substrate 126. As understood in the field, a large variety of semiconductor device fabrication processes may occur prior to forming contact 202. As these processes are well known, they will be described in abbreviated fashion. Initially, pad layers 132, 134 (see FIGS. 2-10) may be removed to re-expose semiconductor layer 130. Pad layers 132, 134 may be removed for example by wet etch, dry etch, or any other now known or later developed semiconductor formation technique for removing pad layers. For example, wherein pad layer 134 (FIGS. 2-10) includes a pad nitride layer, removal may include methods such as but not limited to deglazing and hot phosphoric acid etch or dry etch. For example, wherein pad layer 132 (FIGS. 2-10) includes a pad oxide layer, removal may include methods such as but not limited to a diluted hydrofluoric acid (DHF) etch.

An active, first region 120 may be formed and may include any region of SOI substrate 106 in which active devices are employed. In the instant example, a transistor 210 including silicided source/drain region 212 is formed in the active region, e.g., on semiconductor layer 130. Transistor 210 may otherwise include a channel region 214 in semiconductor layer 130 between source/drain regions 216, 218 of silicided source/drain region 212. Raised source/drain regions 220, 222 may be formed over source/drain regions 216, 218, e.g., by epitaxial growth of silicon germanium, to form part of the silicided source/drain region 212 with source/drain regions 216, 218. As understood, regions 216, 218, 220, 222 may be doped, e.g., by ion implanting or in-situ doped as formed. As also known, a dopant element introduced into semiconductor can establish either p-type (acceptors) or n-type (donors) conductivity. Common dopants in silicon: for p-type—boron (B), indium (In); and for n-type—phosphorous (P) arsenic (As), antimony (Sb). Dopants are of two types—"donors" and "acceptors." N type implants are donors and P type are acceptors.

Transistor 210 may also include a gate 226 including one or more gate dielectric layers 228, including but not limited to: hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Gate 226 may also include a conductive body 230 (e.g., a metal such as copper or tungsten, or polysilicon), a silicide cap 232 and a spacer 234 thereabout. Spacer 234 may include any now known or later developed spacer material such as silicon nitride. Silicide cap 232 on gate 226 and a silicide 240 of silicided source/drain region 212 atop semiconductor layer 130 may be formed using any now known or later developed technique, e.g., performing an in-situ pre-clean, depositing a metal such as titanium, nickel, cobalt, etc., annealing to have the metal react with silicon, and removing unreacted metal.

A contact etch stop layer (CESL) 242 may be formed over active, first region 120 and second region 122, and notably, over silicided source/drain region 212. CESL 242 may include any now known or later developed etch stop material such as silicon nitride. In one embodiment, CESL 242 includes a stress therein, e.g., compressive or tensile, so as to impart a strain to at least part of first region 120, in a known fashion.

Dielectric layer 244 may be formed over CESL 242, e.g., by deposition. Dielectric layer 244 may include may include any interlevel or intralevel dielectric material including inorganic dielectric materials, organic dielectric materials, or combinations thereof. Suitable dielectric materials include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

As shown in FIG. 11, a dummy transistor 246 may be formed over trench isolation 152. Dummy transistor 246 may be formed similarly to transistor 210. FIG. 11 also shows forming a contact opening 250 to silicided source/drain region 212 through CESL 242 and dielectric layer 244, according to embodiments of the disclosure. Contact opening 250 may be formed using photolithography, i.e., with a mask (not shown) which can be removed in a conventional manner once contact opening 250 is formed. As illustrated, contact opening 250 is positioned over a portion of etch stop member 200 such that the etch stop member prevents punch through into trench isolation 152 and further into base substrate 126. In this fashion, etch stop member 200 accommodates mis-alignment of contact opening 250 with silicided source/drain region 212 or oversizing of contact opening 250 (e.g., by overetching), and prevents punch through into trench isolation 152 and further into base substrate 126.

FIG. 12 shows forming a contact 202 in contact opening 250 (FIG. 11). Contact 202 forming may include depositing a liner 260 (darker thick line) in contact opening 250 (FIG. 11), then depositing a conductor 262 in contact opening 250 (FIG. 11) and planarizing the conductor. Liner 260 may include any conventional liner material such as ruthenium; however, other refractory metals such as tantalum (Ta), titanium (Ti), tungsten (W), iridium (Jr), rhodium (Rh) and platinum (Pt), etc., or mixtures of thereof, may also be employed. Conductor 262 may include, for example, copper or tungsten. The planarizing can be carried out using any now known or later developed technique such as but not limited to chemical mechanical planarization (CMP). Conventional forming of back-end-of-line (BEOL) interconnects may be formed hereafter. As illustrated in FIG. 12, etch stop member 200 is structured to prevent punch-through of contact 202 (i.e., a source/drain contact) to base substrate 126, e.g., by preventing etching where it is located. It is emphasized that method of forming contact 202 may include any variety of intermediate steps not described herein but understood with those with skill in the art.

With reference to FIGS. 11 and 12, a cross-sectional view of a structure 270 including etch stop member 200, according to embodiments of the disclosure, is shown. Structure 270 may include SOI substrate 106 including semiconductor layer 130 over insulator layer 128 over base substrate 126. Trench isolation 152 is in SOI substrate 106. Each etch stop member 200 is in a portion of insulator layer 128 and abuts a side of trench isolation 152. Etch stop member 200 may be in a portion of insulator layer 128 abutting a first side of trench isolation 152 and a second side of trench isolation 152. A portion of semiconductor layer 130 may include silicided source/drain region 212, CESL 242 over silicided source/drain region 212, and dielectric layer 244 over CESL 242. Etch stop member 200 has a higher etch selectivity than insulator layer 128. Etch stop member 200 may include, for example, aluminum oxide ($Al_2O_3$) or hafnium oxide ($HfO_2$). Contact 202 extends to a portion of semiconductor layer 130, and etch stop member 200 prevents contact punch through to base substrate 126. More particularly, contact 202 extends to silicided source/drain region 212 through CESL 242 and dielectric layer 244, and is positioned over a portion of etch stop member 200 such that the etch stop member prevents punch-through into base substrate 126. Etch stop member 200 may have a width (side-to-side) between 6 and 12 nanometers, e.g., for a 14 nm technology node. In one embodiment, etch stop member 200 contacts the portion of upper surface 188 (FIG. 9) of base substrate 126.

The methods of forming an etch stop member herein provide a cost effective manner of mitigating edge punch through with minor additional processing involved. The additional processing steps do not significantly increase processing time, and provide additional process margin to prevent source/drain contact shorts to the base substrate.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method, comprising:
   providing a semiconductor-on-insulator (SOI) substrate including a semiconductor layer over an insulator layer over a base substrate;
   forming a trench isolation opening extending into the SOI substrate;
   forming an etch stop member in a portion of the insulator layer abutting a side of the trench isolation opening, the etch stop member having a higher etch selectivity than the insulator layer;
   forming a trench isolation in the trench isolation opening; and
   forming a contact to a portion of the semiconductor layer, the etch stop member preventing contact punch through to the base substrate.

2. The method of claim 1, wherein the etch stop member includes a material selected from the group comprising: aluminum oxide ($Al_2O_3$) and hafnium oxide ($HfO_2$).

3. The method of claim 1, wherein forming the etch stop member includes:
   forming a liner mask on sidewalls of the trench isolation opening that exposes a portion of the insulator layer;
   isotropically etching an opening into the portion of the insulator layer using the liner mask;
   depositing etch stop material in the opening and over sidewalls of the liner mask; and
   etching to remove the etch stop material and the liner mask, leaving the etch stop material in the opening to form the etch stop member.

4. The method of claim 3, wherein the isotropically etching the opening creates the opening into the portion of the insulator layer and exposes a portion of an upper surface of the base substrate, and wherein the etch stop member contacts the portion of the upper surface of the base substrate.

5. The method of claim 3, wherein the liner mask exposes a portion of the insulator layer to a first side and a second side of the trench isolation opening,
   wherein the isotropically etching creates an opening in the first side and the second side of the insulator layer adjacent the trench isolation opening, and
   wherein the etch stop member forming forms the etch stop member in a portion of the insulator layer abutting the first side and the second side of the trench isolation opening.

6. The method of claim 3, wherein forming the liner mask includes:
   depositing a sacrificial material in the trench isolation opening;
   recessing the sacrificial material in the trench isolation opening to create an upper surface of the sacrificial material below an upper surface of the insulator layer;
   forming a liner over the upper surface of the sacrificial material and on sidewalls of the trench isolation opening; and
   removing the liner from the upper surface of the sacrificial material and removing the sacrificial material, leaving the liner on sidewalls of the trench isolation opening to create the liner mask, wherein a lower end of the liner mask is above a lower surface of the insulator layer.

7. The method of claim 6, wherein removing the liner and the sacrificial material includes etching using an oxygen-based plasma.

8. The method of claim 6, wherein the sacrificial material includes one of an organic planarization layer (OPL) material and a spin-on-hard mask (SOH) material, and the liner includes silicon nitride ($Si_3N_4$).

9. The method of claim 1, further comprising, prior to forming the contact:
   forming a silicided source/drain region on the semiconductor layer;
   forming a contact etch stop layer (CESL) over the silicided source/drain region; and
   forming a dielectric layer over the CESL,
   wherein forming the contact includes:
      forming a contact opening to the silicided source/drain region through the CESL and the dielectric layer, wherein the contact opening is positioned over a portion of the etch stop member such that the etch stop member prevents punch-through into the base substrate; and
      forming the contact in the contact opening.

10. The method of claim 1, wherein the etch stop member has a thickness that is less than a thickness of the insulator layer.

11. The method of claim 1, wherein the etch stop member has a width between 6 and 12 nanometers.

12. A structure, comprising:
   a semiconductor-on-insulator (SOI) substrate including a semiconductor layer over an insulator layer over a base substrate;
   a trench isolation in the SOI substrate;
   an etch stop member in a portion of the insulator layer abutting a side of the trench isolation, the etch stop member having a higher etch selectivity than the insulator layer; and
   a contact to a portion of the semiconductor layer, the etch stop member structured to prevent contact punch through to the base substrate.

13. The structure of claim 12, wherein the etch stop member includes a material selected from the group comprising: aluminum oxide ($Al_2O_3$) and hafnium oxide ($HfO_2$).

14. The structure of claim 12, wherein the etch stop member is in a portion of the insulator layer abutting a first side of the trench isolation and a second side of the trench isolation.

15. The structure of claim 12, wherein the portion of the semiconductor layer includes a silicided source/drain region, a contact etch stop layer (CESL) over the silicided source/drain region, and a dielectric layer over the CESL, and wherein the contact extends to the silicided source/drain region through the CESL and the dielectric layer and is positioned over a portion of the etch stop member, the etch stop member preventing punch-through into the base substrate.

16. The structure of claim 12, wherein the etch stop member has a width between 6 and 12 nanometers.

17. The structure of claim 12, wherein the etch stop member contacts a portion of an upper surface of the base substrate.

18. The structure of claim 12, wherein the SOI substrate includes fully depleted SOI substrate.

\* \* \* \* \*